United States Patent
Cho et al.

(10) Patent No.: US 8,934,304 B2
(45) Date of Patent: Jan. 13, 2015

(54) OPERATING METHOD OF NONVOLATILE MEMORY DEVICE AND OPERATING METHOD OF MEMORY SYSTEM INCLUDING NONVOLATILE MEMORY DEVICE

(75) Inventors: Hyunsoo Cho, Buchoen-si (KR); Kyoungil Bang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 215 days.

(21) Appl. No.: 13/471,485

(22) Filed: May 15, 2012

(65) Prior Publication Data

US 2012/0294092 A1    Nov. 22, 2012

(30) Foreign Application Priority Data

May 16, 2011    (KR) .................. 10-2011-0045877

(51) Int. Cl.
*G11C 11/406*    (2006.01)
*G11C 16/10*    (2006.01)
*G11C 16/34*    (2006.01)

(52) U.S. Cl.
CPC .............. *G11C 11/406* (2013.01); *G11C 16/10* (2013.01); *G11C 16/3418* (2013.01)
USPC ............ 365/185.22; 365/185.24; 365/189.07; 365/185.03; 365/207

(58) Field of Classification Search
USPC .......... 365/185.22, 189.07, 207, 185.24, 210, 365/185.03
See application file for complete search history.

(56) References Cited

U.S. PATENT DOCUMENTS

| | | | |
|---|---|---|---|
| 5,963,473 A | 10/1999 | Norman | |
| 6,584,015 B2 | 6/2003 | Katayama et al. | |
| 7,286,412 B1 * | 10/2007 | Chen | 365/185.24 |
| 7,394,692 B2 | 7/2008 | Chen et al. | |
| 7,765,426 B2 | 7/2010 | Li | |
| 8,023,323 B2 | 9/2011 | Kang et al. | |
| 2006/0206770 A1 | 9/2006 | Chen et al. | |
| 2009/0207666 A1 * | 8/2009 | Park et al. | 365/185.25 |
| 2009/0323419 A1 | 12/2009 | Lee et al. | |
| 2010/0027335 A1 | 2/2010 | Kim et al. | |

FOREIGN PATENT DOCUMENTS

| | | |
|---|---|---|
| JP | 2009-176340 A | 8/2009 |
| KR | 20070001446 A | 1/2007 |
| KR | 20080061220 A | 7/2008 |
| KR | 1020080064476 A | 7/2008 |
| KR | 100885914 B1 | 2/2009 |
| KR | 1020100001355 A | 1/2010 |
| KR | 1020100013485 A | 2/2010 |
| KR | 20100062161 A | 6/2010 |
| KR | 1020100001355 A | 8/2010 |
| KR | 1020100091414 A | 8/2010 |
| KR | 1020120001405 A | 1/2012 |

* cited by examiner

*Primary Examiner* — Richard Elms
*Assistant Examiner* — Mohammed A Bashar
(74) *Attorney, Agent, or Firm* — Volentine & Whitt, PLLC

(57) ABSTRACT

A nonvolatile memory device includes a plurality of memory cells and a plurality of monitor cells. The method of operating the device includes erasing the plurality of memory cells and the plurality of monitor cells, programming at least one first memory cell among the plurality of memory cells to a first program state, programming at least one first monitor cell among the plurality of monitor cells to the first program state, and refreshing data stored in the plurality of memory cells according to a result read from the at least one first monitor cell during a read operation of the at least one first monitor cell.

17 Claims, 17 Drawing Sheets

OPERATING METHOD OF NONVOLATILE MEMORY DEVICE AND OPERATING METHOD OF MEMORY SYSTEM INCLUDING NONVOLATILE MEMORY DEVICE

CROSS-REFERENCE TO RELATED APPLICATIONS

A claim of priority under 35 U.S.C §119 is made to Korean Patent Application No. 10-2011-0045877, filed May 16, 2011, the entirety of which is incorporated by reference herein.

BACKGROUND

Exemplary embodiments generally relate to memory devices, and more particularly, exemplary embodiments relate to methods of operating nonvolatile memory devices and to methods of operating memory systems which include nonvolatile memory devices.

Nonvolatile memory devices are generally characterized by the retention of stored data even in the absence of supplied power. Examples of nonvolatile memory devices include read only memory (ROM), programmable ROM (PROM), erasable programmable ROM (EPROM), electrically erasable programmable ROM (EEPROM), flash memory (e.g., NOR type and NAND-type), and nonvolatile random access memory (RAM) such a phase-change RAM (PRAM), magnetoresistive RAM (MRAM), resistive RAM (RRAM), ferroelectric RAM (FRAM0, or the like.

Despite the nonvolatile characteristics of nonvolatile memory devices, the integrity of data stored in the nonvolatile memory devices may deteriorate over time. In addition, when data is programmed in memory cells of the nonvolatile memory device, the programming action can alter the storage state (e.g., threshold state) of memory cells located adjacent to the programmed memory cells. These and other influences can lead to read errors in memory cells that where initially properly programmed.

SUMMARY

One aspect of embodiments of the inventive concept is directed to provide a method of operating a nonvolatile memory device, where the nonvolatile memory device includes a plurality of memory cells and a plurality of monitor cells. The method includes erasing the plurality of memory cells and the plurality of monitor cells, programming at least one first memory cell among the plurality of memory cells to a first program state, programming at least one first monitor cell among the plurality of monitor cells to the first program state, and refreshing data stored in the plurality of memory cells according to a result read from the at least one first monitor cell during a read operation of the at least one first monitor cell.

Another aspect of embodiments of the inventive concept is directed to provide a method of operating a memory system, where the memory system includes a nonvolatile memory device having a plurality of memory cells and a plurality of monitor cells, and a controller configured to control the nonvolatile memory device. The method includes erasing the plurality of memory cells according to an erase command from the controller by the nonvolatile memory device, programming at least one memory cell of the plurality of memory cells to a program state and at least one monitor cell of the plurality of monitor cells to a program monitor state according to a write command from the controller by the nonvolatile memory device, refreshing the plurality of memory cells according to a result read from the at least one monitor cell during a read operation of the at least one monitor cell.

Yet another aspect of embodiments of the inventive concept is directed to provide a method of operating a nonvolatile memory device, where the nonvolatile memory device includes a memory cell array including a plurality of memory cells and a plurality of monitor cells, and where a programmed state of each memory cell and each monitor cell is determined by a threshold voltage of each memory cell and monitor cell. The method includes erasing the memory cells and the monitor cells, and programming at least one the memory cells and at least one of the monitor cells from an erase state to a first program state according to memory cell write data and monitor cell write data, respectively. The at least one of the memory cells is programmed to the first program state by executing a programming operation using a memory cell read verification voltage, and the at least one of the monitor cells is programmed to the first program state by executing a programming operation using a monitor cell read verification voltage. The method further includes reading the monitor cells to obtain monitor data, comparing the monitor data with monitor cell write data to obtain a comparison result, and executing a refresh operation of the memory cells in accordance with the comparison result.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
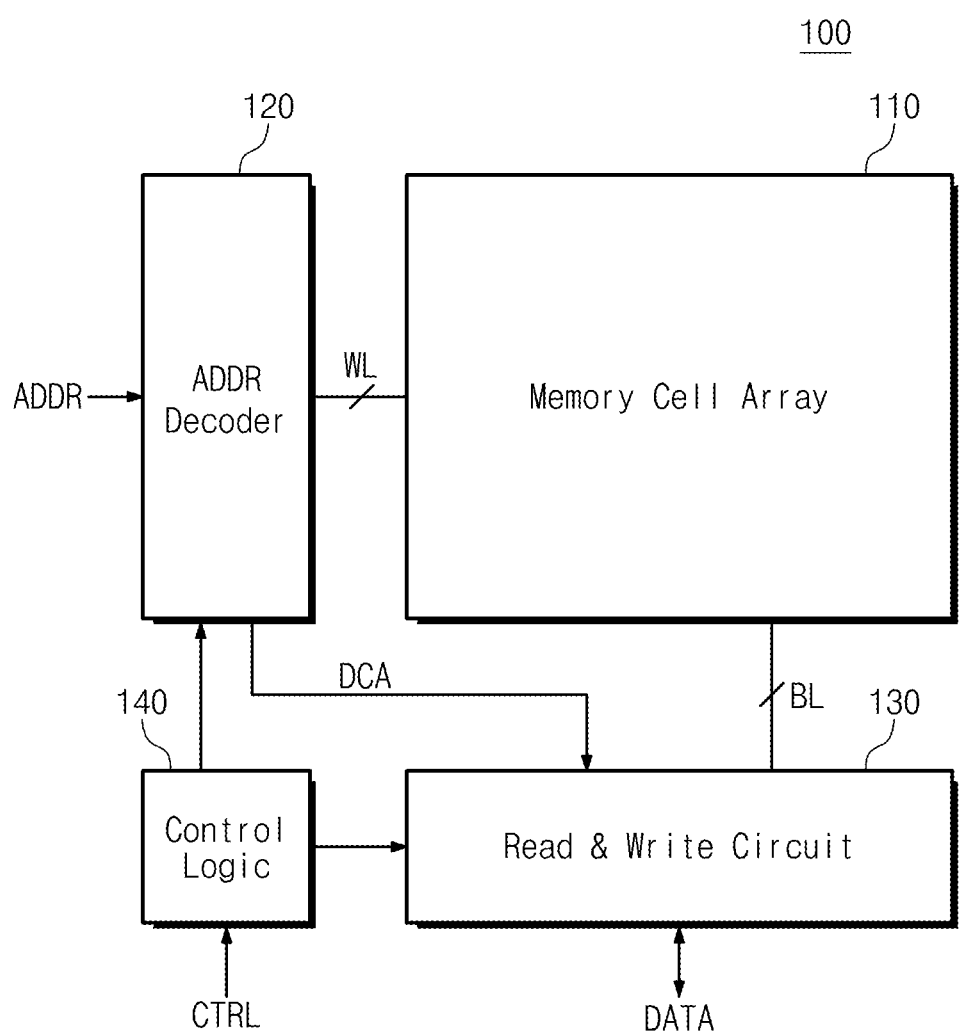
FIG. 1 is a block diagram illustrating a nonvolatile memory device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a nonvolatile memory device according to an exemplary embodiment of the inventive concept. Referring to FIG. 1, a nonvolatile memory device 100 of this example includes a memory cell array 110, an address decoder 120, a read/write circuit 130, and control logic 140.

The memory cell array 110 may be connected with the address decoder 120 via word lines WL and with the read/write circuit 130 via bit lines BL. The memory cell array 110 includes a plurality of memory cells. In an exemplary embodiment, memory cells arranged in a row direction may be connected with the word lines WL. Memory cells arranged in a column direction may be connected with the bit lines BL. In an exemplary embodiment, each of the memory cells of the memory cell array 110 may store one or more bits of data, respectively. In this embodiment, the memory cell array 110 furthers include a plurality of monitor cells. The memory cells and the monitor cells of the memory cell array 110 will be more fully described with reference to FIG. 2.

The address decoder 120 may be coupled with the memory cell array 110 via the word lines WL. The address decoder 120 may be configured to operate in response to the control of the control logic 140. The address decoder 120 may receive an address ADDR from an external device.

The address decoder 120 may be configured to decode a row address of the input address ADDR. The address decoder 120 may select the word lines WL using the decoded row address. The address decoder 120 may be configured to decode a column address of the input address ADDR. The decoded column address DCA may be transferred to the read/write circuit 130. In an exemplary embodiment, the address decoder 120 may include a number of constituent elements which are not shown, such as a row decoder, a column decoder, an address buffer, and the like.

The read/write circuit 130 may be connected with the memory cell array 110 via the bit lines BL. The read/write circuit 130 may operate responsive to the control of the control logic 140. The read/write circuit 130 may be configured to exchange data with the external device. The read/write circuit 130 may be configured to select the bit lines BL using the decoded column address DCA from the address decoder 120.

In an exemplary embodiment, the read/write circuit 130 may be configured to receive data from the external device and to write the input data in the memory cell array 110. The read/write circuit 130 may be configured to read data from the memory cell array 110 and to output it to the external device. The read/write circuit 130 may be configured to read data from the first storage region of the memory cell array 110 and to write it in the second storage region thereof. For example, the read/write circuit 130 may perform a copy-back operation.

In an exemplary embodiment, the read/write circuit 130 may include a number of constituent elements not shown, such as a page buffer (or, a page register), a column selector circuit, a data buffer, and the like. Alternatively, the read/write circuit 130 may include a number of other constituent elements not shown, such as a sense amplifier, a write driver, a column selector circuit, a data buffer, and the like.

The control logic 140 may be coupled with the address decoder 120 and the read/write circuit 130. The control logic 140 may be configured to control a overall operation of the nonvolatile memory device 100. The control logic 140 may operate responsive to a control signal CTRL transferred from the external device.

Figure 2:
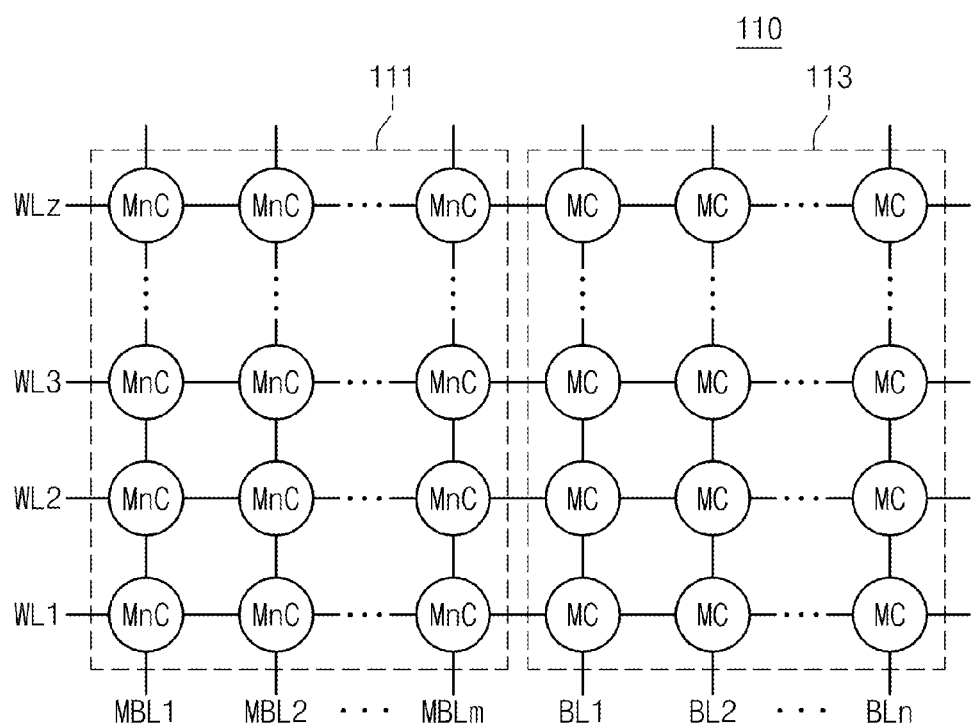
FIG. 2 is a diagram illustrating memory cells and monitor cells of a memory cell array in FIG. 1.

FIG. 2 is a diagram illustrating an example of memory cells and monitor cells of a memory cell array in FIG. 1. Referring to FIG. 2, a plurality of word lines WL1 to WLz, a plurality of monitor bit lines MBL1 to MBLm, and a plurality of bit lines BL1 to BLn are illustrated.

One word line may be connected with plural monitor cells MnC and plural memory cells MC. The monitor bit lines MBL1 to MBLm may be connected with monitor cells MnC arranged in a column direction. The bit lines BL1 to BLn may be connected with memory cells MC arranged in a column direction. In the diagram, the monitor cells MnC constitute a monitor cell region 111, and the memory cells MC constitute a memory cell region 113.

The memory cells MC may have the same structure as the monitor cells MnC. Below, the terms "cells" or "cell" may be used to indicate memory cells MC and monitor cells MnC.

The memory cells MC and the monitor cells MnC may be programmed, read, and erased using the same algorithm. The memory cells MC may be used to store user data, and the monitor cells MnC may be used to store a specific pattern.

In an exemplary embodiment, reading and writing may be executed on a word line basis. That is, data may be read from plural memory cells MC and plural monitor cells MnC at a read operation. Alternatively, reading and writing on the cells MnC and MC may be made by the word or cell.

Below, the inventive concept will be described with reference to a NAND flash memory device. However, the inventive concept is not limited thereto.

A memory cell MC of the NAND flash memory may be formed of a transistor including a charge storage layer. A threshold voltage of a memory cell may vary by the Fowler-Nordheim tunneling. Charges may be accumulated or trapped by the charge storage layer when a high voltage is applied to a gate of a memory cell MC and a low voltage is applied to its body. If charges are accumulated or trapped by the charge storage layer, a threshold voltage of a memory cell MC may increase. Charges may be discharged from the charge storage layer when a low voltage is applied to a gate of a memory cell MC and a high voltage is applied to its body. If charges are discharged from the charge storage layer, a threshold voltage of the memory cell MC may decrease. Data stored in the memory cell MC may be judged according to a threshold voltage of the memory cell MC.

When a specific cell is programmed, threshold voltages of cells adjacent to the specific cell may increase. When a threshold voltage of the specific cell increases, threshold voltages of the adjacent cells may increase due to coupling. If threshold voltages of the adjacent cells increase, the probability may increase that an error arises from the adjacent cells.

Also, upon reading of a specific (selected) cell, threshold voltages of unselected cells (i.e., cells not to be read) may increase. A high voltage may be applied to the unselected cells to turn on the unselected cells. At this time, the F-N tunneling may occur at the unselected cells. If the F-N tunneling occurs, threshold voltages of the unselected cell (i.e., cell not to be read) may increase. This can increase the error probability associated with the unselected cells.

Further, when a given cell is programmed, the threshold voltage thereof my gradually deteriorate (decrease) with the lapse of time. This is because charges accumulated or trapped by a charge storage layer of the cell may be discharged over time. This too can increase the error probability.

In FIG. 2, there is exemplarily shown the case that a plurality of monitor cells MnC is connected with one word line. However, one word line can be coupled with at least one monitor cell MnC.

Figure 3:
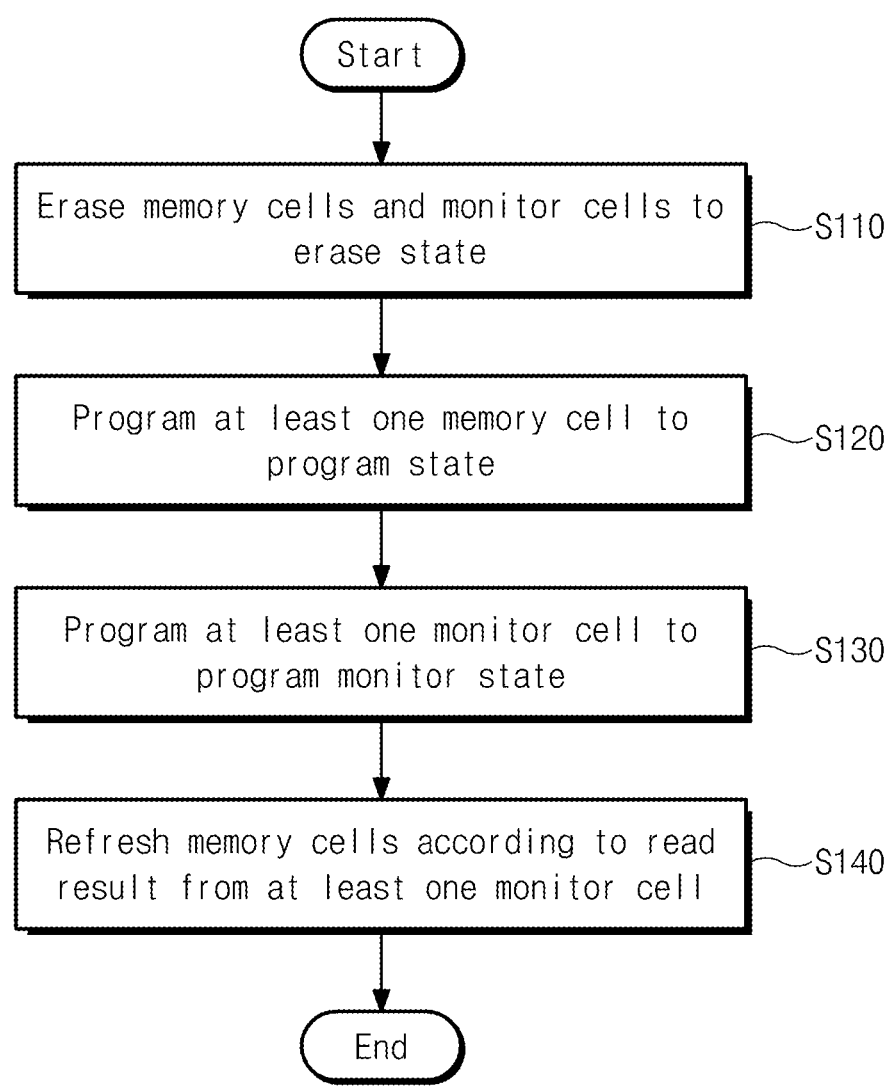
FIG. 3 is a flowchart illustrating an operating method of a nonvolatile memory device according to an exemplary embodiment of the inventive concept.

FIG. 3 is a flowchart illustrating an operating method of a nonvolatile memory device according to an exemplary embodiment of the inventive concept. Referring to FIGS. 1 to 3, in operation S110, memory cells MC and monitor cells MnC may be erased to have an erase state E. In operation S120, at least one memory cell may be programmed to have a program state P. In operation S130, at least one monitor cell may be programmed to have a program monitor state M. In operation S140, memory cells may be refreshed depending upon a result read from the at least one monitor cell MnC.

Figure 4:
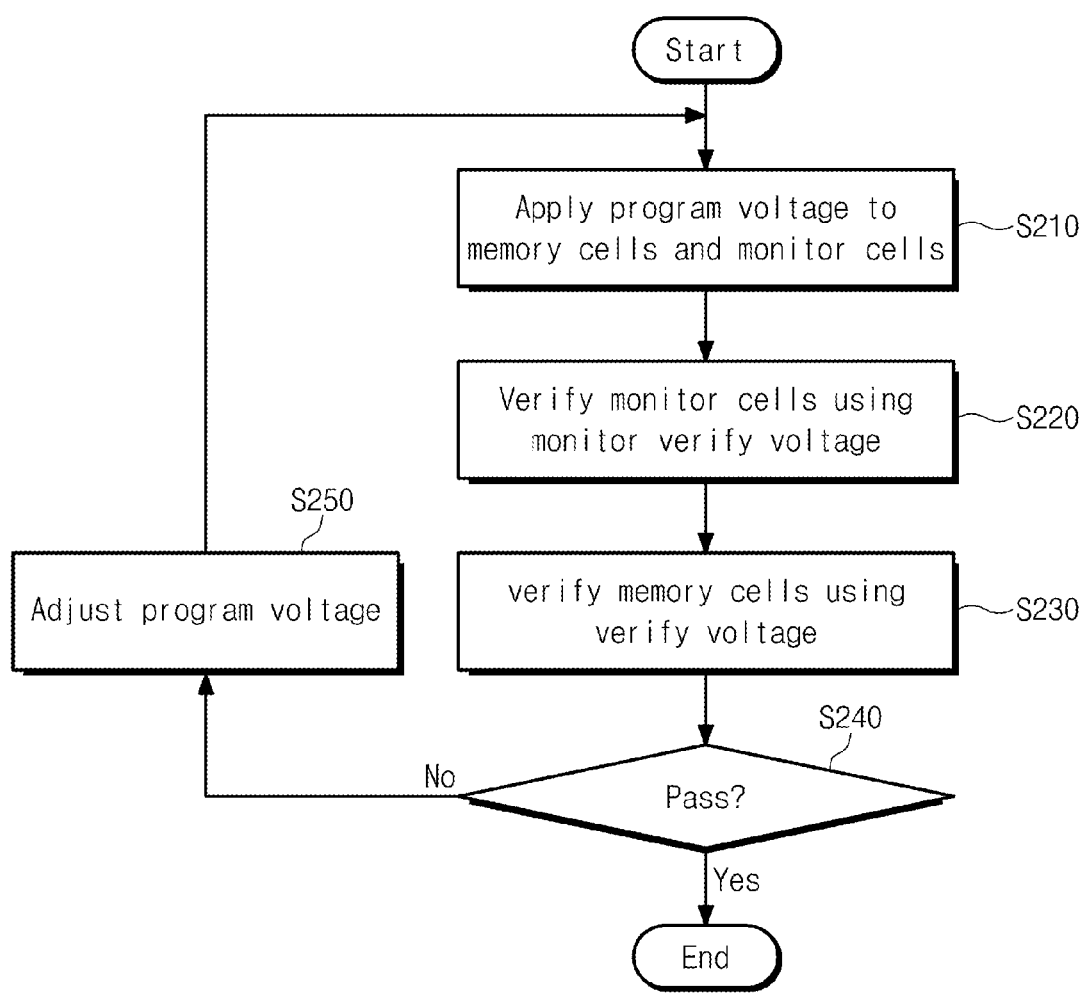
FIG. 4 is a flowchart illustrating a program method of a nonvolatile memory device according to an exemplary embodiment of the inventive concept.
Figure 5:
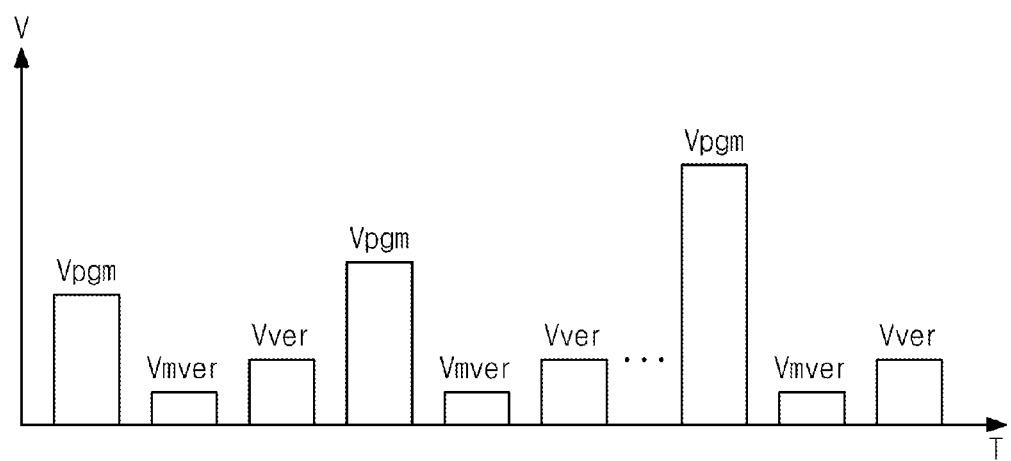
FIG. 5 is a timing diagram illustrating voltages supplied to memory cells and monitor cells via word line according to a program method in FIG. 4.

FIG. 4 is a flowchart illustrating a program method of a nonvolatile memory device according to an exemplary embodiment of the inventive concept. FIG. 5 is a timing diagram illustrating voltages supplied to memory cells and monitor cells via word line according to a program method in FIG. 4.

Referring to FIGS. 1 to 5, in operation S210, a program voltage Vpgm may be applied to memory cells MC and monitor cells MnC. For example, the program voltage Vpgm may be applied to memory cells MC and monitor cells MnC commonly connected to a same word line. When the program voltage Vpgm is applied to the word line, threshold voltages of at least one programmed memory cell MC and at least one programmed monitor cell MnC may increase. That is, the memory cells MC and the monitor cells MnC may be programmed simultaneously.

In operation S220, the monitor cells MnC may be verified using a monitor verification voltage Vmver. That is, there may be judged whether a threshold voltage of the at least one programmed monitor cell MnC reaches the monitor verification voltage Vmver.

In operation S230, memory cells MC may be verified using a verification voltage Vver. That is, there may be judged whether a threshold voltage of the at least one programmed memory cell MC reaches the verification voltage Vver. The monitor verification voltage Vmver may be different in level from the verification voltage Vver. The monitor verification voltage Vmver may be lower in level that the verification voltage Vver.

In operation S240, there may be judged whether the memory cells MC and the monitor cells MnC are program passed. If a threshold voltage of the at least one programmed monitor cell MnC is higher in level than the monitor verification voltage Vmver, the monitor cells MnC may be judged to be program passed. If a threshold voltage of the at least one programmed memory cell MC is higher in level than the verification voltage Vver, the memory cells MC may be judged to be program passed. Afterwards, in this case, the method may be terminated.

If the memory cells MC and the monitor cells MnC are judged to be program failed, in operation S250, the program voltage Vpgm may be adjusted. For example, a level of the program voltage Vpgm may increase. Afterwards, the method proceeds to operation S210.

Operations S210 to S230 for applying the program voltage Vpgm and the verification voltages Vver and Vmver may constitute a program loop. In operation S240, if at least one of the at least one programmed memory cell MC and the at least one programmed monitor cell MnC is judged to be program failed, the program loop (S210 to S230) may be iteratively performed with the program voltage Vpgm being increased in operation S250.

At iteration of program loops, if a threshold voltage of the at least one programmed monitor cell is higher than the monitor verification voltage Vmver, that is, if a threshold voltage of the at least one programmed monitor cell is program passed, application of the monitor verification voltage Vmver may be stopped. At iteration of program loops, if a threshold voltage of the at least one programmed memory cell is higher than the verification voltage Vver, that is, if a threshold voltage of the at least one programmed memory cell is program passed, application of the verification voltage Vver may be stopped.

Figure 6:
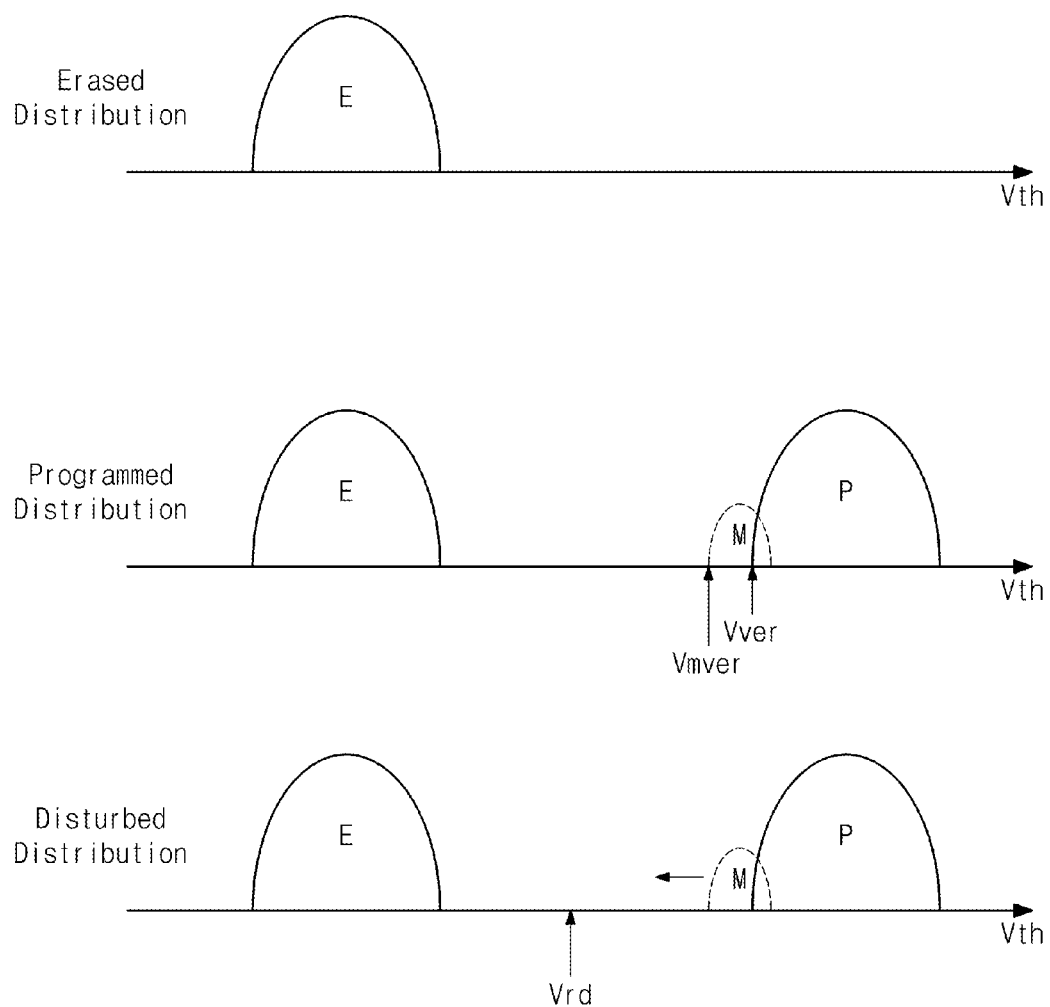
FIG. 6 is a diagram for describing a variation of threshold voltages of memory cells and monitor cells when a program operation is performed according to a program method in FIGS. 4 and 5.

FIG. 6 is a diagram for describing a variation of threshold voltages of memory cells and monitor cells when a program operation is performed according to a program method as shown in FIGS. 4 and 5. Referring to FIGS. 4 to 6, threshold voltages of erased memory cells MC and monitor cells MnC may form an erased distribution.

At least one memory cell MC having an erase state E may be programmed to a program state P using a verification voltage Vver. A threshold voltage of the at least one programmed memory cell MC can be higher in level than the verification voltage Vver. At least one monitor cell MnC having an erase state E may be programmed to a program monitor state M using a monitor verification voltage Vmver. A threshold voltage of the at least one programmed monitor cell MC can be higher in level than the monitor verification voltage Vmver.

The monitor verification voltage Vmver may be lower in level than the verification voltage Vver and higher in level than a read voltage Vrd used to judge the erase state E and the program state P. Accordingly, the program monitor state M may be formed at a level higher than the read voltage Vrd and at a lower distribution level than the program state P. After operations S210 to S250 are executed, a distribution of threshold voltages of the memory cells MC and the monitor cells MnC may correspond to a programmed distribution such as that shown in FIG. 6.

Referring to a disturbed distribution in FIG. 6, threshold voltages of monitor cells MnC and memory cells MC of the program state P may decrease with the lapse of time. Since the program monitor state M is formed at a level lower than the program state P, the program monitor state M may reach the read voltage Vrd prior to the program state P. If the program monitor state M reaches the read voltage Vrd, an error may arise from a read result of at least one programmed monitor cell MnC. For example, the at least one programmed monitor cell MnC may be read as an erase state.

If the program monitor state M reaches the read voltage Vrd, the program state P may be judged to come close to the read voltage Vrd. Accordingly, the error probability on the at least one programmed memory cell MC may increase, thus calling for the execution of a refresh operation.

Figure 7:
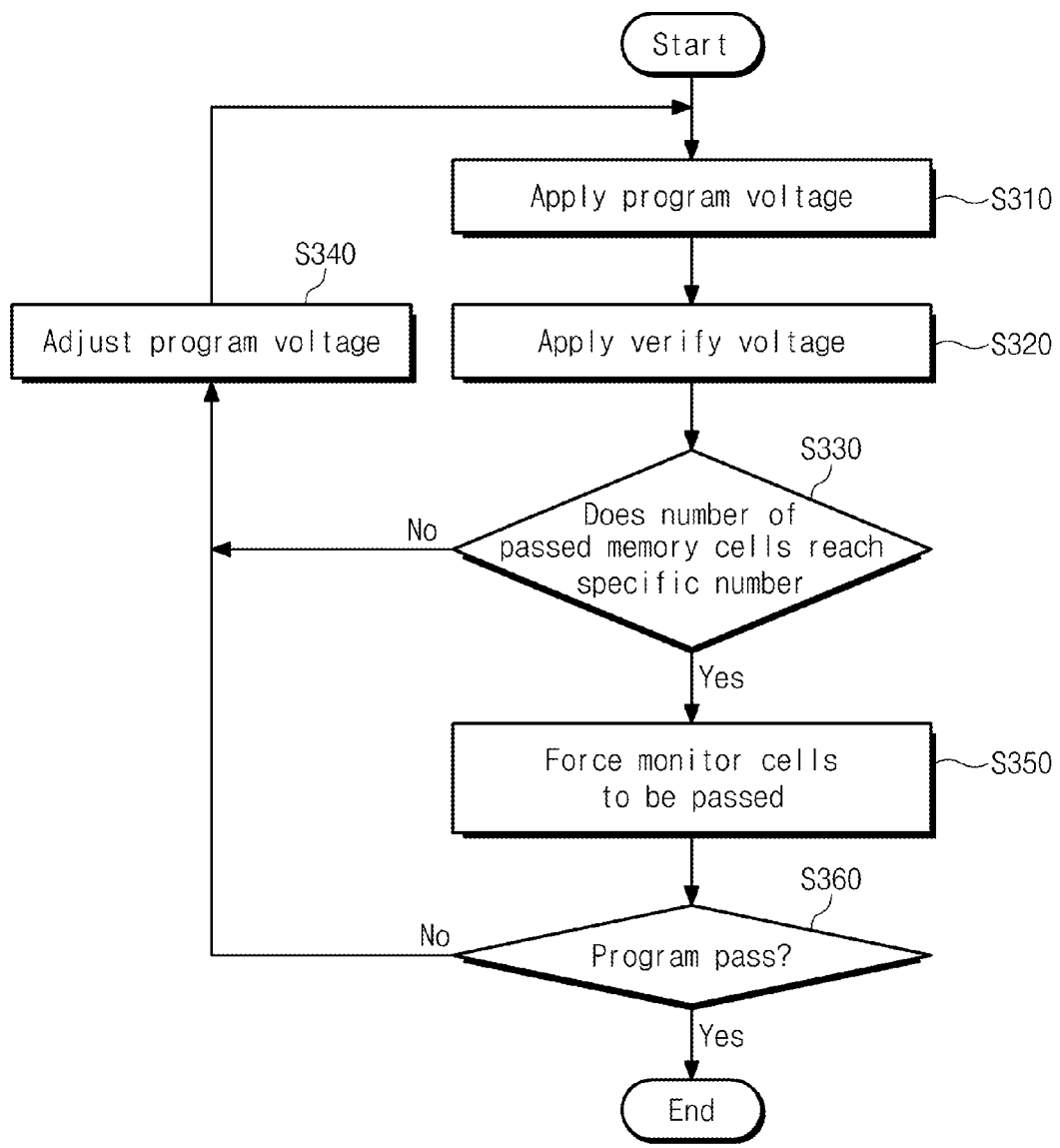
FIG. 7 is a flowchart for describing a program method of a nonvolatile memory device according to another exemplary embodiment of the inventive concept.

FIG. 7 is a flowchart for describing a program method of a nonvolatile memory device according to another exemplary embodiment of the inventive concept. Referring to FIG. 7, in operation S310, a program voltage Vpgm may be applied. At this time, threshold voltages of at least one memory cell MC and at least one monitor cell MnC may increase.

In operation S320, a verification voltage Vver may be supplied. There may be judged whether a threshold voltage of the at least one programmed memory cell MC reaches the verification voltage Vver.

In operation S330, there may be judged whether the number of passed memory cells reaches a specific number. Until the number of passed memory cells reaches a specific number, a program loop (S310 to S320) may be iteratively performed with the program voltage Vpgm being adjusted in operation S340. If the number of passed memory cells reaches a specific number, in operation S350, the monitor cells MnC may be program passed. For example, although program failed monitor cells MnC exist, the monitor cells MnC may be treated to be program passed.

In operation S360, there may be judged whether the memory cells MC are program passed. If at least one memory cell MC is judged to be program failed, a program loop (S310 to S320) may be iteratively performed with the program voltage Vpgm being adjusted in operation S340.

Memory cells MC may include fast cells which are programmed more quickly than other memory cells. Memory cells program passed prior to the other memory cells may be fast cells. Until the fast cells are program passed, threshold voltages of the other memory cells MC may be lower than the verification voltage Vver. If monitor cells MnC are treated to be program passed when the fast cells are program passed, threshold voltages of the monitor cells MnC may be distributed at a level lower than the verification voltage Vver. That is, as illustrated in FIG. 6, a program monitor state M may be formed at a level lower than a program state P.

In an exemplary embodiment, two or more monitor cells MnC may be programmed to have the same program monitor state. For example, monitor cells connected with one word line may be programmed as shown in the following table 1.

TABLE 1

| MnC1 | MnC2 | MnC3 | MnC4 |
|---|---|---|---|
| E | E | M | M |

In the table 1, "E" indicates an erase state, and "M" indicates a program monitor state.

Refreshing may be executed when an error is detected from a read result of at least one of monitor cells MnC3 and MnC4 programmed to have the program monitor state M.

The number of monitor cells programmed to have the same state can increase as compared with the table 1. For example, monitor cells may be programmed as shown in the following table 2.

TABLE 2

| MnC1 | MnC2 | MnC3 | MnC4 | MnC5 | MnC6 | MnC7 | MnC8 |
|---|---|---|---|---|---|---|---|
| E | E | E | E | M | M | M | M |

Refresh determination may be made according to the number of error-free monitor cells of monitor cells MnC5 to MnC8 programmed to have the program monitor state M and the number of erroneous monitor cells thereof. For example, refreshing may be executed when a majority of the monitor cells MnC5 to MnC8 (programmed to have the program monitor state M) contain errors.

In an exemplary embodiment, among the monitor cells MnC, monitor cells maintaining the erase state E and monitor cells programmed to have the program monitor state M may be fixed in location. Accordingly, when an erase state E is detected from a monitor cell MnC of a specific location, whether an error exists at a read result of the monitor cell MnC of the specific location may be judged.

Figure 8:
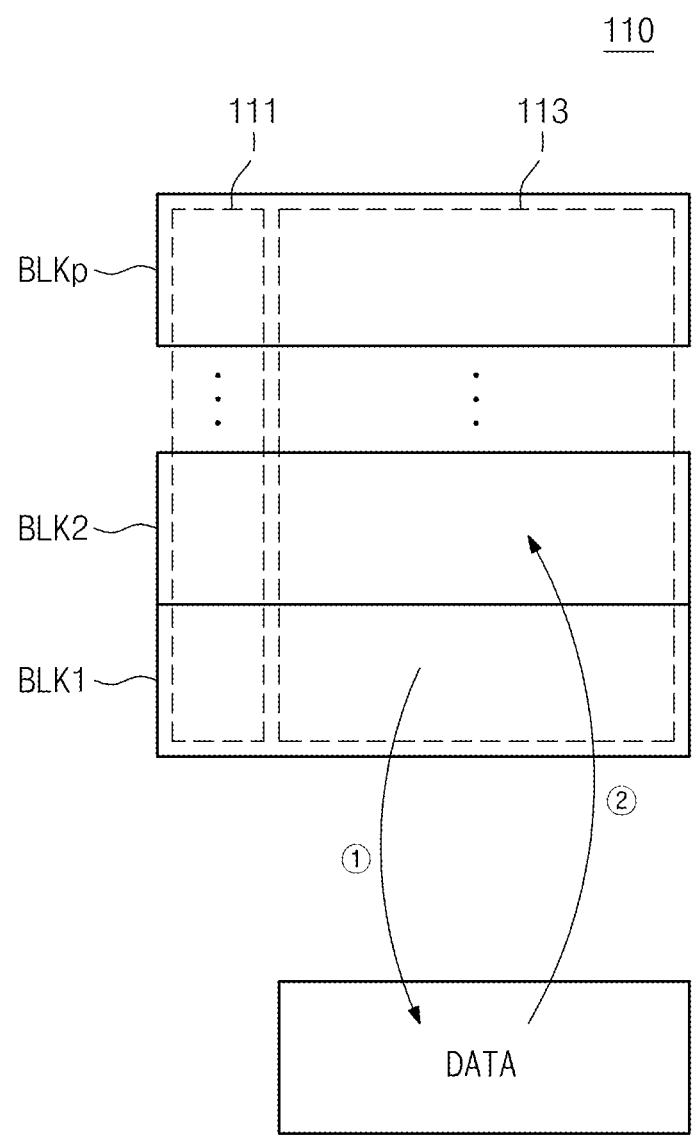
FIG. 8 is a diagram for describing a refresh method according to an exemplary embodiment of the inventive concept.

FIG. 8 is a diagram for describing a refresh method according to an exemplary embodiment of the inventive concept. A memory cell array 110 is shown in FIG. 8. The memory cell array 110 may include a plurality of memory blocks BLK1 to BLKp, each of which is divided into a monitor cell region 111 and a memory cell region 113.

In an exemplary embodiment, the first memory block BLK1 may be refreshed. That is, data stored in the first memory block BLK1 may be read out, and thereafter, the read data may be written in a free memory block, for example, the second memory block BLK2.

In an exemplary embodiment, the refreshing may be made on the basis of a page, word line or word, but not by the memory block.

During refreshing, a read/write circuit 130 in FIG. 1 may read data stored in the first memory block BLK1 and may write the read data in the second memory block BLK2. That is, the refreshing may be made by a copy-back operation of the read/write circuit 130.

During refreshing, the read/write circuit 130 may read data stored in the first memory block BLK1 and may output the read data to an external device. Data output to the external device may be corrected, and the corrected data may be transferred to the read/write circuit 130. The read/write circuit 130 may write the input data in the second memory block BLK2.

Figure 9:
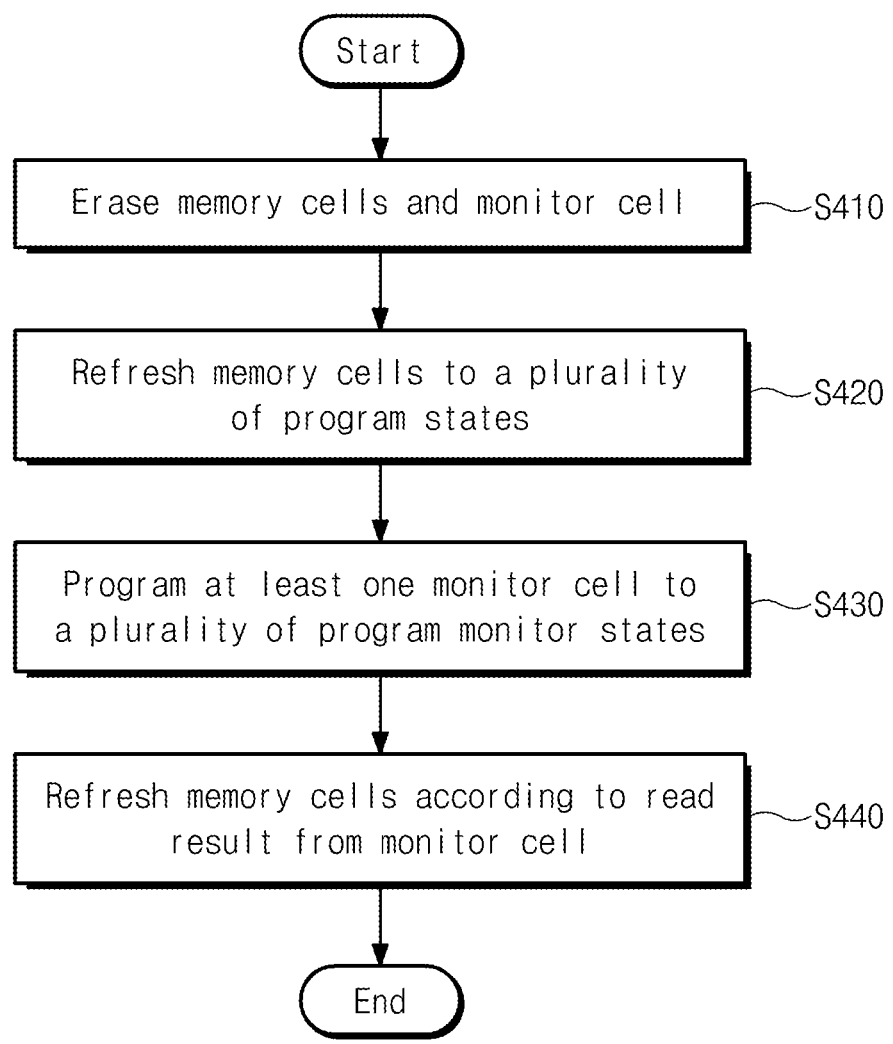
FIG. 9 is a flowchart illustrating an operating method of a nonvolatile memory device according to another exemplary embodiment of the inventive concept.
Figure 10:
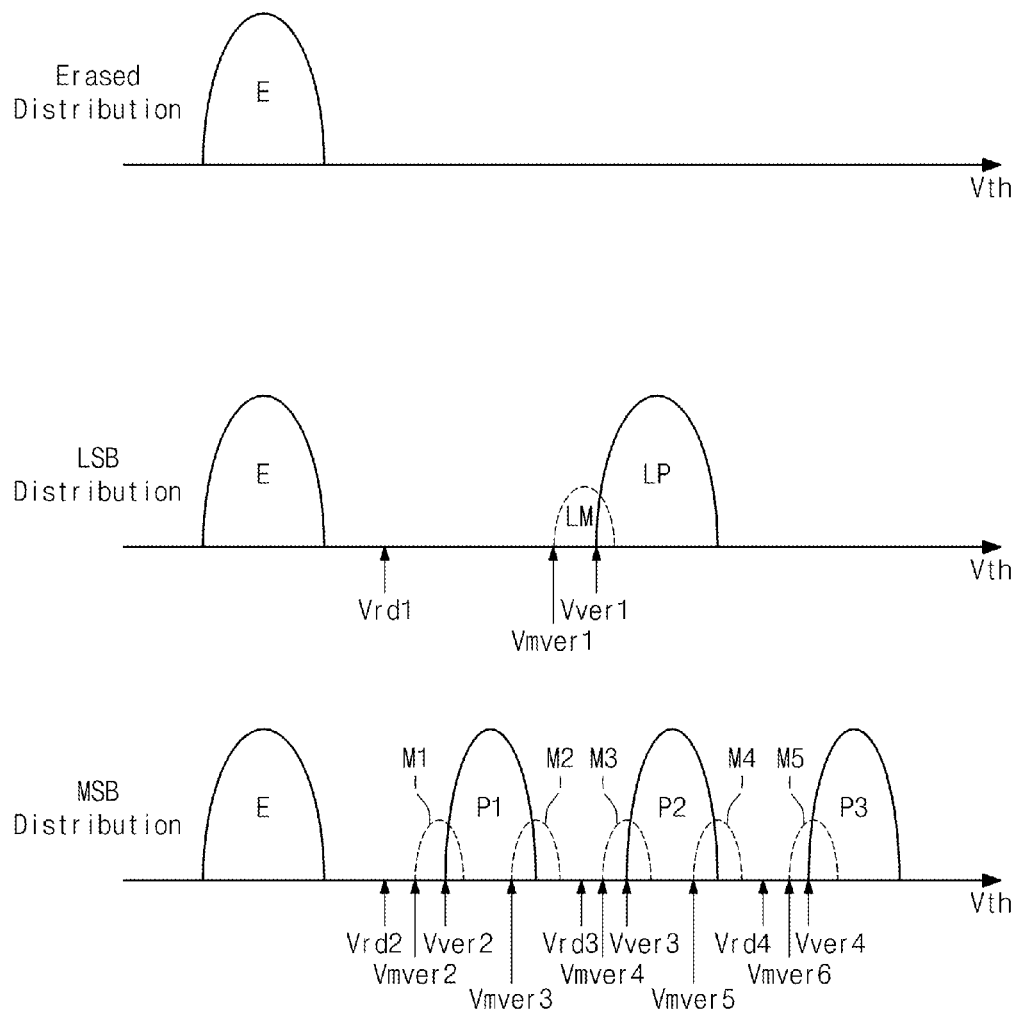
FIG. 10 is a diagram illustrating threshold voltages of memory cells and monitor cells according to an operating method in FIG. 9.

FIG. 9 is a flowchart illustrating an operating method of a nonvolatile memory device according to another exemplary embodiment of the inventive concept. FIG. 10 is a diagram illustrating threshold voltages of memory cells and monitor cells according to an operating method in FIG. 9. Referring to FIGS. 1, 2, 9, and 10, in operation S410, memory cells MC and monitor cells MnC may be erased to have an erase state E. Threshold voltages of erased memory cells and monitor cells may form an erased distribution.

In operation S420, memory cells MC may be programmed to have a plurality of program states LP, P1, P2, and P3, and monitor cells MnC may be programmed to have a plurality of program monitor states LM, M1, M2, M3, M4, and M5.

In an exemplary embodiment, at LSB (least significant bit) programming, memory cells MC may be programmed using the first verification voltage Vver1. The memory cells MC may be programmed to have an LSB program state LP. Monitor cells MnC may be programmed using the first monitor verification voltage Vmver1. The monitor cells MnC may be programmed to have an LSB program monitor state LM. The first monitor verification voltage Vmver1 may be lower than the verification voltage Vver1 and higher than the first read voltage Vrd1 used to judge the erase state E and the LSB program state LP. The LSB program monitor state LM may be formed at a level higher than the first read voltage Vrd1 and lower than the LSB program state LP.

In an exemplary embodiment, at MSB (most significant bit) programming, the memory cells MC may be programmed to have the first program state P1 using the second verification voltage Vver2, to have the second program state P2 using the third verification voltage Vver3, and to have the third program state P3 using the fourth verification voltage Vver4.

The monitor cells MnC may be programmed to have the first program monitor state M1 using the second monitor verification voltage Vmver2. The second monitor verification voltage Vmver2 may be lower than the second verification voltage Vver2 and higher than the second read voltage Vrd2 used to judge the erase state E and the first program state P1. The first program monitor state M1 may be formed at a level higher than the second read voltage Vrd2 and lower than the first program state P1.

The monitor cells MnC may be programmed to have the second program monitor state M2 using the third monitor verification voltage Vmver3. The third monitor verification voltage Vmver3 may be higher than the second verification voltage Vver2. The third monitor verification voltage Vmver3 may be adjusted such that the second monitor state M2 is formed at a level lower than the third read voltage Vrd3 used to judge the first program state P1 and the second program state P2. The second program monitor state M2 may be formed at a level higher than the first program state P1 and lower than the third read voltage Vrd3.

The monitor cells MnC may be programmed to have the third program monitor state M3 using the fourth monitor verification voltage Vmver4. The fourth monitor verification voltage Vmver4 may be lower than the third verification voltage Vver3 and higher than the third read voltage Vrd3. The third program monitor state M3 may be formed at a level lower than the second program state P2 and higher than the third read voltage Vrd3.

The monitor cells MnC may be programmed to have the fourth program monitor state M4 using the fifth monitor verification voltage Vmver5. The fifth monitor verification voltage Vmver5 may be higher than the third verification voltage Vver3 and lower than the fourth read voltage Vrd4 used to judge the second and third program states P2 and P3. The fourth program monitor state M4 may be formed at a level higher than the second program state P2 and lower than the fourth read voltage Vrd4.

The monitor cells MnC may be programmed to have the fifth program monitor state M5 using the sixth monitor verification voltage Vmver6. The sixth monitor verification voltage Vmver6 may be lower than the fourth verification voltage Vver4 and higher than the fourth read voltage Vrd4. The fifth program monitor state M5 may be formed at a level lower than the third program state P3 and higher than the fourth read voltage Vrd4.

In operation S440, refreshing may be carried out according to a read result of the monitor cells MnC.

If monitor cells MnC programmed to have the LSB program monitor state LM are read as an erase state E, the error probability may increase due to lowering of threshold voltages of memory cells MC programmed to have the LSB program state LP.

If monitor cells MnC programmed to have the first program monitor state M1 is read as an erase state E, the error probability may increase due to lowering of threshold voltages of memory cells MC programmed to have the first program state P1.

If monitor cells MnC programmed to have the second program monitor state M2 is read as the second program state P2, the error probability may increase due to lowering of threshold voltages of memory cells MC programmed to have the first program state P1.

If monitor cells MnC programmed to have the third program monitor state M3 is read as the first program state P1, the error probability may increase due to lowering of threshold voltages of memory cells MC programmed to have the second program state P2.

If monitor cells MnC programmed to have the fourth program monitor state M4 is read as the third program state P3, the error probability may increase due to lowering of threshold voltages of memory cells MC programmed to have the second program state P2.

If monitor cells MnC programmed to have the fifth program monitor state M5 is read as the second program state P2, the error probability may increase due to lowering of threshold voltages of memory cells MC programmed to have the third program state P3.

Refreshing may be carried when the error probability on memory cells MC is judged to have increased.

In an exemplary embodiment, if the error probability on at least one of a plurality of program states LP, P1, P2, and P3 increases, refreshing may be carried out.

A plurality of monitor cells MnC may be programmed to have the same program monitor state. In an exemplary embodiment, monitor cells MnC may be programmed as illustrated in the following table 3.

TABLE 3

| WLi | E | E | E | E | E | E | E | E | E | LM | LM | LM | LM | LM | LM | LM | LM | LM |
|---|---|---|---|---|---|---|---|---|---|---|---|---|---|---|---|---|---|---|
| WLj | E | E | E | M1 | M1 | M1 | M2 | M2 | M2 | M3 | M3 | M3 | M4 | M4 | M4 | M5 | M5 | M5 |

Locations of monitor cells MnC programmed to have a specific program monitor state may be fixed.

When adjacent cells are programmed, monitor cells MnC may be programmed according to a specific pattern to minimize the affects of coupling from adjacent cells.

Figure 11:
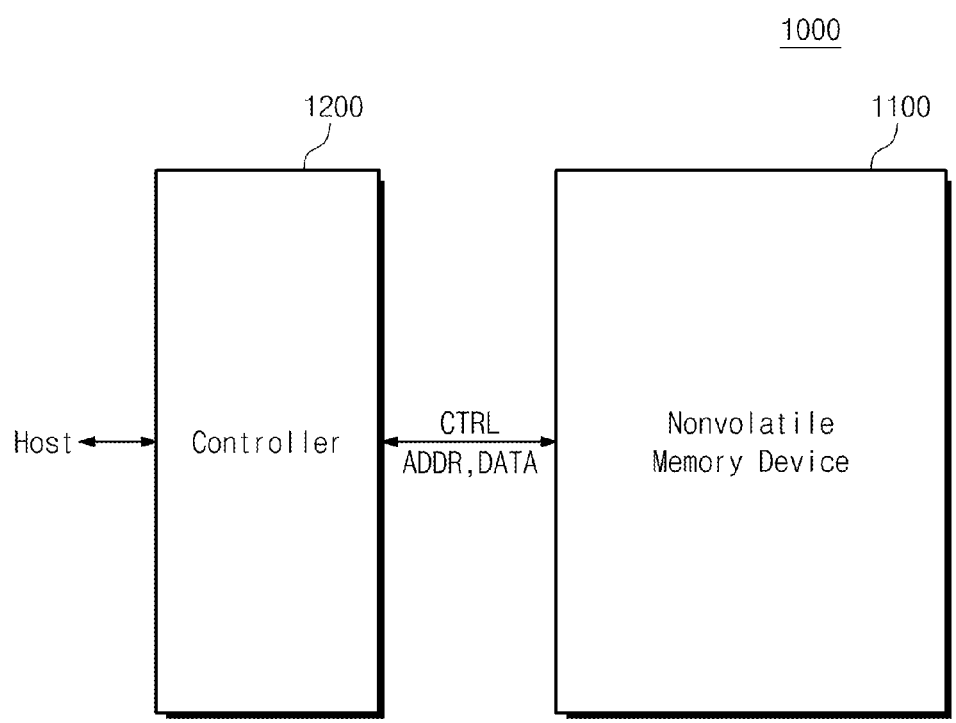
FIG. 11 is a block diagram illustrating a memory system according to an exemplary embodiment of the inventive concept.

FIG. 11 is a block diagram illustrating a memory system according to an exemplary embodiment of the inventive concept. Referring to FIG. 11, a memory system 1000 may include a nonvolatile memory device 1100 and a controller 1200.

The nonvolatile memory device 1100 may receive a control signal CTRL and an address ADDR from the controller 1200. The nonvolatile memory device 1100 may exchange data with the controller 1200. The nonvolatile memory device 1100 may be configured to have the same structure as a nonvolatile memory device 100 in FIG. 1. Further, the nonvolatile memory device 1100 may be configured to operate the same method as the nonvolatile memory device 100 in FIG. 1.

The controller 1200 may be connected with a host and the nonvolatile memory device 1100. The controller 1200 may be configured to access the nonvolatile memory device 1100 in response to a request of the host. For example, the controller 1200 may be configured to control read, write, erase, and background operations of the nonvolatile memory device 1100. The controller 1200 may be configured to provide an interface between the nonvolatile memory device 1100 and the host. The controller 1200 may be configured to drive firmware for controlling the nonvolatile memory device 1100.

In an exemplary embodiment, the controller 1200 may include a number of constituent elements not shown, such as a RAM, a processing unit, a host interface, a memory interface, and the like. The RAM may be used as at least one of a working memory of the processing unit, a cache memory between the nonvolatile memory device 1100 and the host, and a buffer memory between the nonvolatile memory device 1100 and the host. The processing unit may control an overall operation of the controller 1200.

The host interface may communicate with the host according to various communication protocols. For example, the host interface may communicate with the host according to at least one of various communication protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, an IDE (Integrated Drive Electronics) protocol, and a FireWire. The memory interface may interface with the nonvolatile memory device 1100. For example, the memory interface may include a NAND interface or a NOR interface.

The memory system 1000 may further include an ECC block. The ECC block may be configured to detect and correct an error of data read from the nonvolatile memory device 1100 using ECC. In an exemplary embodiment, the ECC block may be provided as an element of the controller 1200. Alternatively, the ECC block may be provided as an element of the nonvolatile memory device 1100.

The controller 1200 and the nonvolatile memory device 1100 may be integrated in a single semiconductor device. The controller 1200 and the nonvolatile memory device 1100 may be integrated in a single semiconductor device to form a memory card. For example, the controller 1200 and the nonvolatile memory device 1100 may be integrated in a single semiconductor device to form a memory card such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, or the like.

The controller 1200 and the nonvolatile memory device 1100 may be integrated in a single semiconductor device to form a solid state drive (SSD). The SSD may include a storage device configured to store data using a semiconductor memory. In the event that the memory system 1000 is formed of the SSD, an operating speed of a host connected with the memory system 1000 may be improved remarkably.

In some embodiments, the memory system 1000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/ player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

In an exemplary embodiment, the nonvolatile memory device 1100 or the memory system 1000 may be packaged by any of a variety of different package technologies, including PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 12:
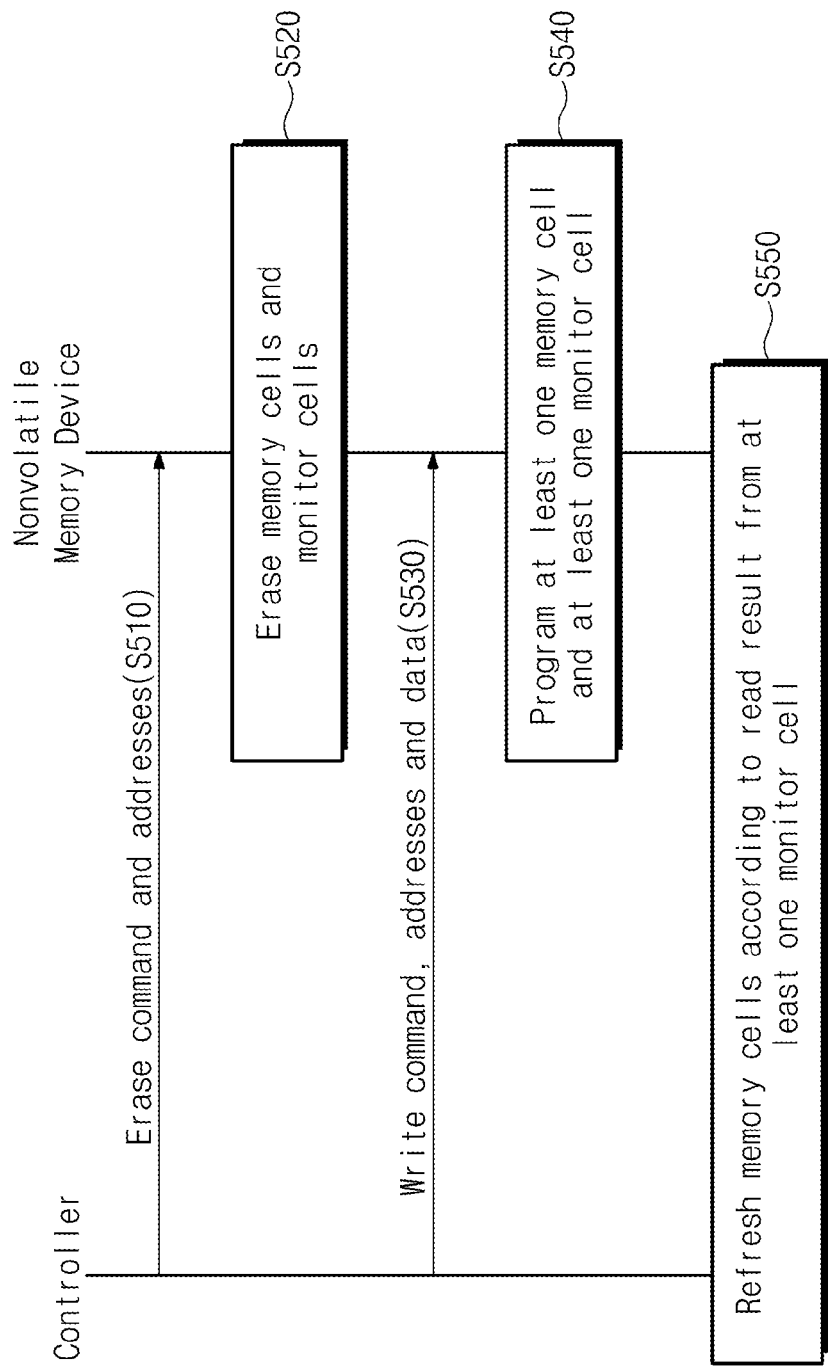
FIG. 12 is a flowchart illustrating an operating method of a memory system according to an exemplary embodiment of the inventive concept.

FIG. 12 is a flowchart illustrating an operating method of a memory system according to an exemplary embodiment of the inventive concept. Referring to FIGS. 11 and 12, in operation S510, a controller 1200 may transfer an erase command and addresses to a nonvolatile memory device 1100.

In operation S520, in response to the erase command input from the controller 1200, the nonvolatile memory device 1100 may erase memory cells MC and monitor cells MnC corresponding to the input addresses.

In operation S530, the controller 1200 may send a write command, addresses, and data to the nonvolatile memory device 1100.

In operation S540, in response to the write command input from the controller 1200, the nonvolatile memory device 1100 may program memory cells corresponding to the input addresses with the input data. At this time, the nonvolatile memory device 1100 may program monitor cells MnC at the same time as described with reference to FIGS. 1 to 10. Memory cells MC may be programmed to have at least one program state, and monitor cells MnC may be programmed to have at least one program monitor state.

In operation S550, memory cells MC may be refreshed according to a read result of the at least one monitor cell MnC.

Figure 13:
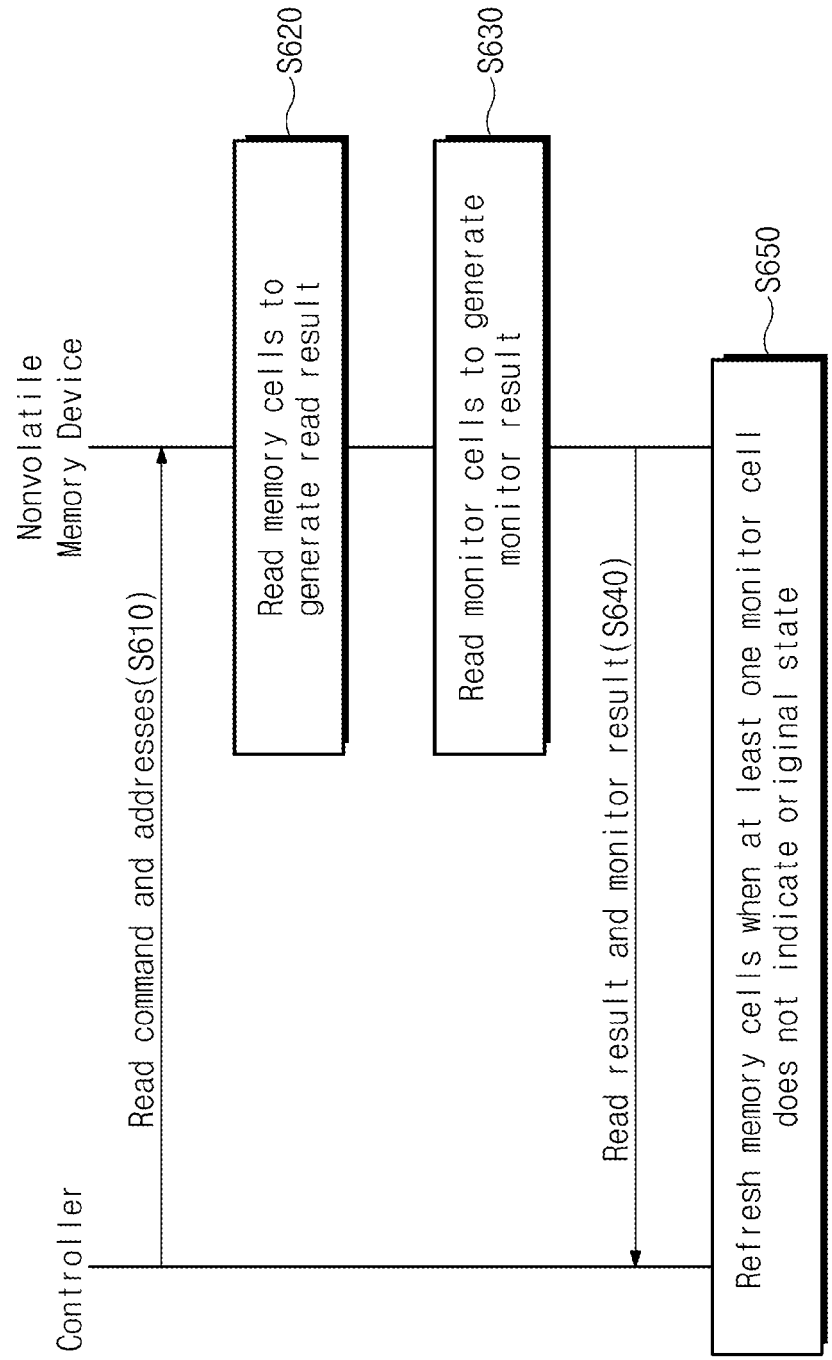
FIG. 13 is a flowchart illustrating a refresh method according to an exemplary embodiment of the inventive concept.

FIG. 13 is a flowchart illustrating a refresh method according to an exemplary embodiment of the inventive concept. Referring to FIGS. 11 and 13, in operation S610, a controller 1200 may transfer a read command and addresses to a nonvolatile memory device 1100.

In operation S620, the nonvolatile memory device 1100 may read memory cells MC corresponding to the input addresses to generate a read result.

In operation S630, the nonvolatile memory device 1100 may read monitor cells MnC corresponding to the input addresses to generate a monitor result. The monitor result may be data read from the monitor cells MnC. The monitor result may be the number of errors generated from the read result of the monitor cells MnC.

In operation S640, the nonvolatile memory device 1100 may send the read result and the monitor result to the controller 1200.

In operation S650, memory cells may be refreshed when at least one monitor cell does not indicate an originally programmed state. The controller 1200 may control the nonvolatile memory device 1100 so as to perform a refresh operation.

The controller 1200 can read data to be refreshed from the nonvolatile memory device 1100 to store it in a free storage space of the nonvolatile memory device 1100.

Figure 14:
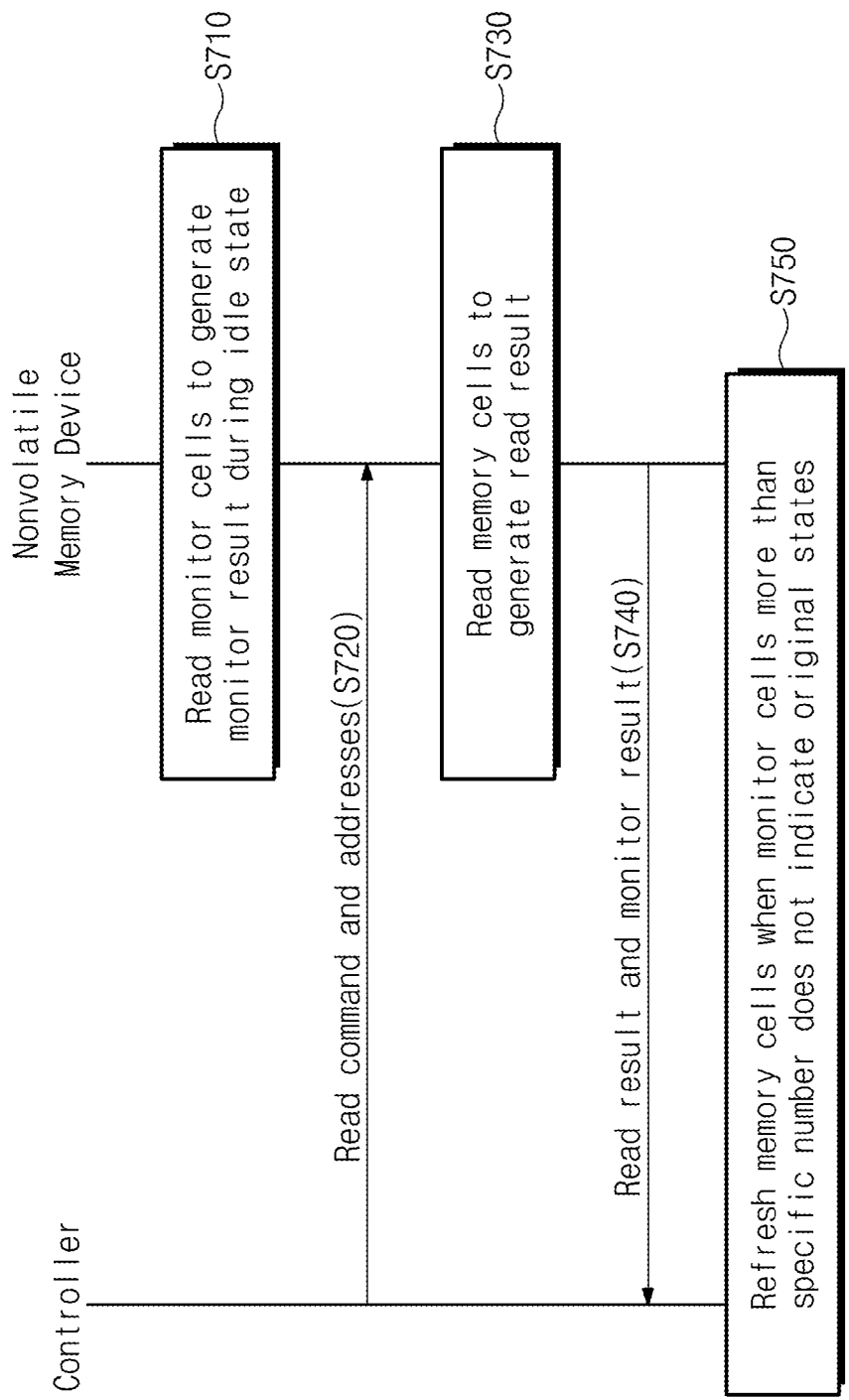
FIG. 14 is a flowchart illustrating a refresh method according to another exemplary embodiment of the inventive concept.

FIG. 14 is a flowchart illustrating a refresh method according to another exemplary embodiment of the inventive concept. Referring to FIG. 14, in operation S710, a nonvolatile memory device 1100 may read monitor cells MnC to generate a monitor result, during an idle time. For example, the nonvolatile memory device 1100 may read all monitor cells MnC to generate a monitor result. The nonvolatile memory device 1100 may divide monitor cells into a plurality of groups and may sequentially read monitor cell groups during an idle state of the nonvolatile memory device time to generate a monitor result.

In operation S720, the controller 1200 may send a read command and read addresses to the nonvolatile memory device 1100.

In operation S730, the nonvolatile memory device 1100 may read memory cells MC corresponding to the input addresses to generate a read result.

In operation S740, the nonvolatile memory device 1100 may send the monitor result together with the read result to the controller 1200.

In operation S750, refreshing may be made when states of monitor cells of a specific number are not originally programmed states. The specific number may be an integer of 1 or more.

Figure 15:
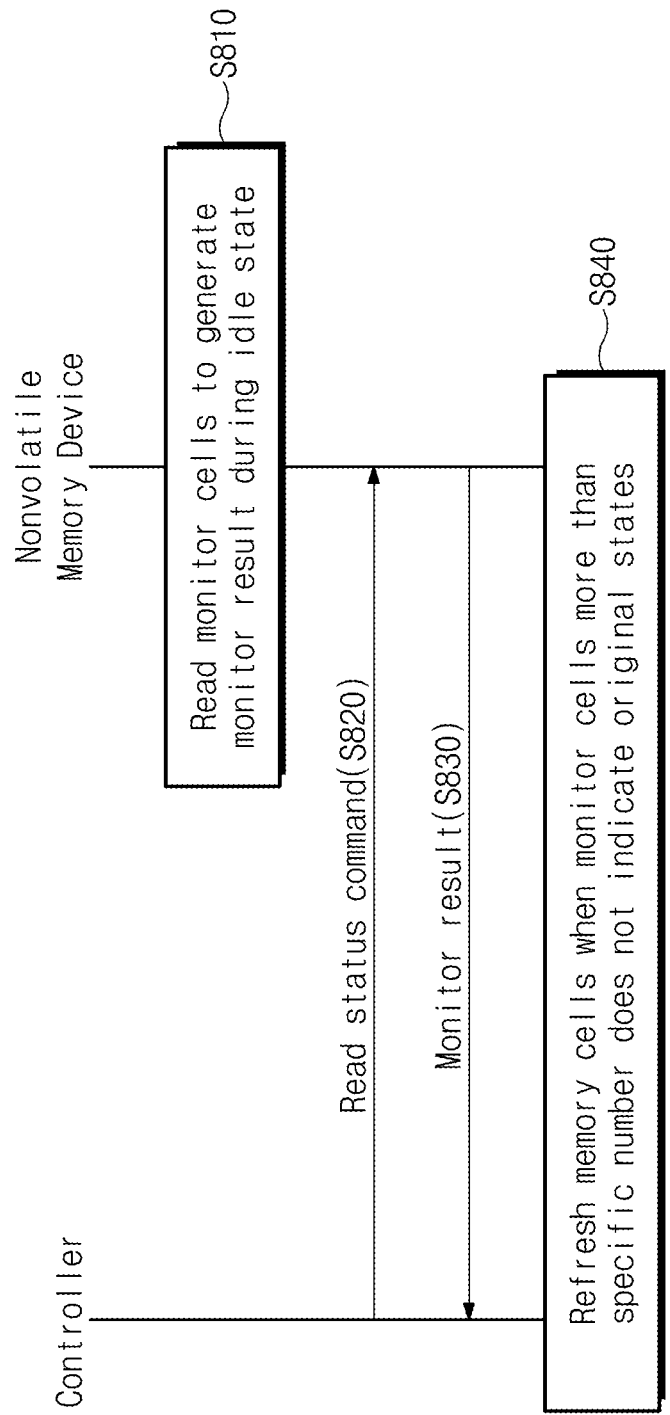
FIG. 15 is a flowchart illustrating a refresh method according to still another exemplary embodiment of the inventive concept.

FIG. 15 is a flowchart illustrating a refresh method according to still another exemplary embodiment of the inventive concept. Referring to FIG. 15, in operation S810, a nonvolatile memory device 1100 may read monitor cells MnC to generate a monitor result, during an idle state of the nonvolatile memory device 1100. For example, the nonvolatile memory device 1100 may read all monitor cells MnC to generate a monitor result. The nonvolatile memory device 1100 may divide monitor cells into a plurality of groups and may sequentially read monitor cell groups during each idle state to generate a monitor result.

In operation S820, a controller r1200 may transfer a read status command to the nonvolatile memory device 1100.

In operation S830, the nonvolatile memory device 1100 may send the monitor result to the controller 1200.

In operation S840, refreshing may be made when states of monitor cells of a specific number are not originally programmed states. The specific number may be an integer of 1 or more.

As is understood from the above description, refreshing may be made according to a read result of a monitor cell. Since an increase in the error probability associated with memory cells is detected according to the read result of the monitor cell, it is possible to make a determination as to when refresh operation should be carried out.

Figure 16:
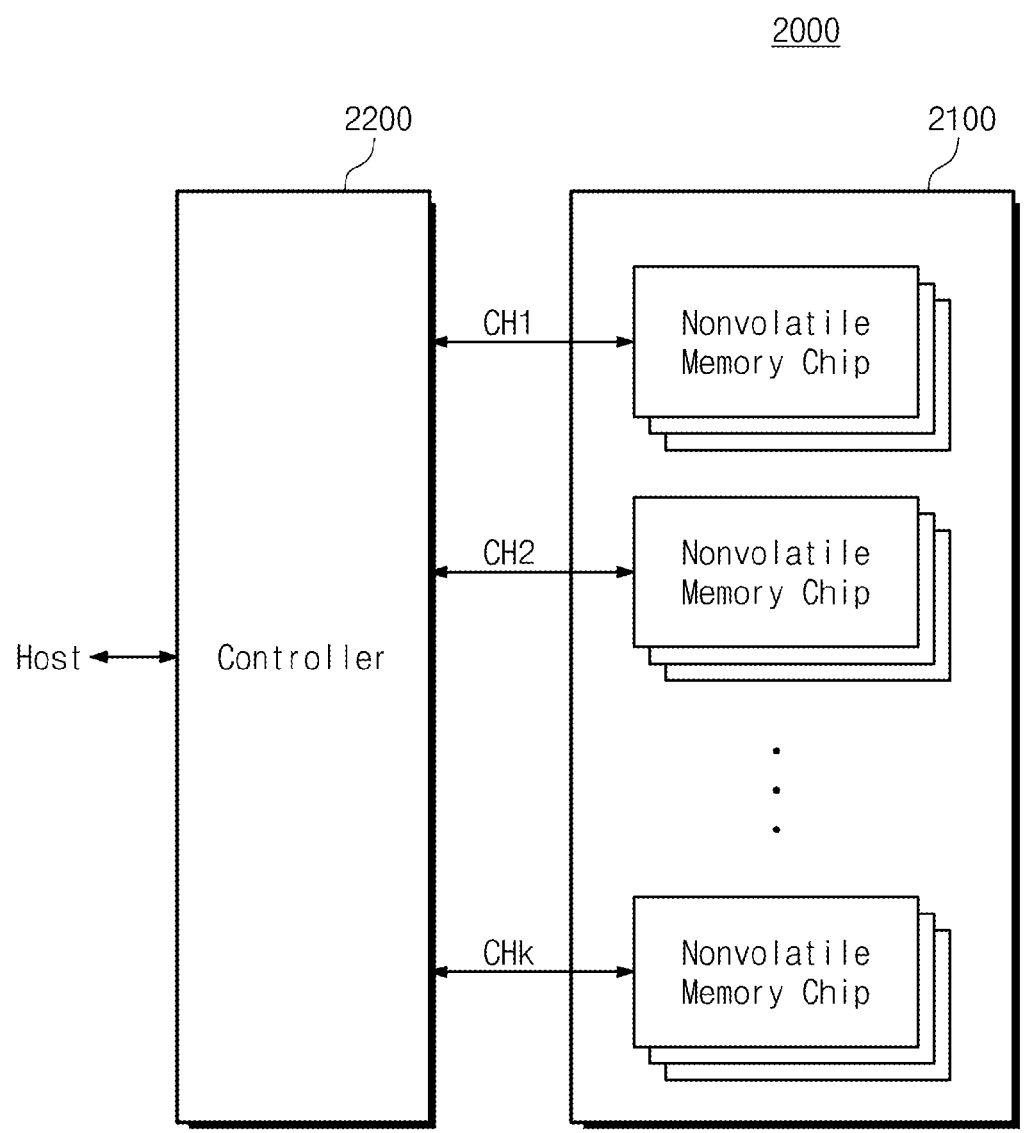
FIG. 16 is a block diagram illustrating a memory system according to another exemplary embodiment of the inventive concept.

FIG. 16 is a block diagram illustrating a memory system according to another exemplary embodiment of the inventive concept. Referring to FIG. 16, a memory system 2000 may include a nonvolatile memory device 2100 and a controller 2200. The nonvolatile memory device 2100 may include a plurality of nonvolatile memory chips. The plurality of nonvolatile memory chips may be divided into groups. Nonvolatile memory chips in each group may communicate with the controller 2200 via a common channel. In an exemplary embodiment, plural nonvolatile memory chips may communicate with the controller 2200 via channels CH1 to CHk, exemplarily.

Each nonvolatile memory chip may have the same structure as a nonvolatile memory device 100 described with reference to FIG. 1. Further, each nonvolatile memory chip may operate in the same method as the nonvolatile memory device 100 described with reference to FIG. 1.

The memory system 1000 may operate in the same method as a memory system 1000 described with reference to FIG. 11. That is, the memory system 2000 may perform a refresh operation according to a read result of monitor cells MnC.

In FIG. 16, there is exemplarily illustrated the case that one channel is connected with a plurality of nonvolatile memory chips. However, the memory system 2000 can be modified such that one channel is connected with one nonvolatile memory chip.

Figure 17:
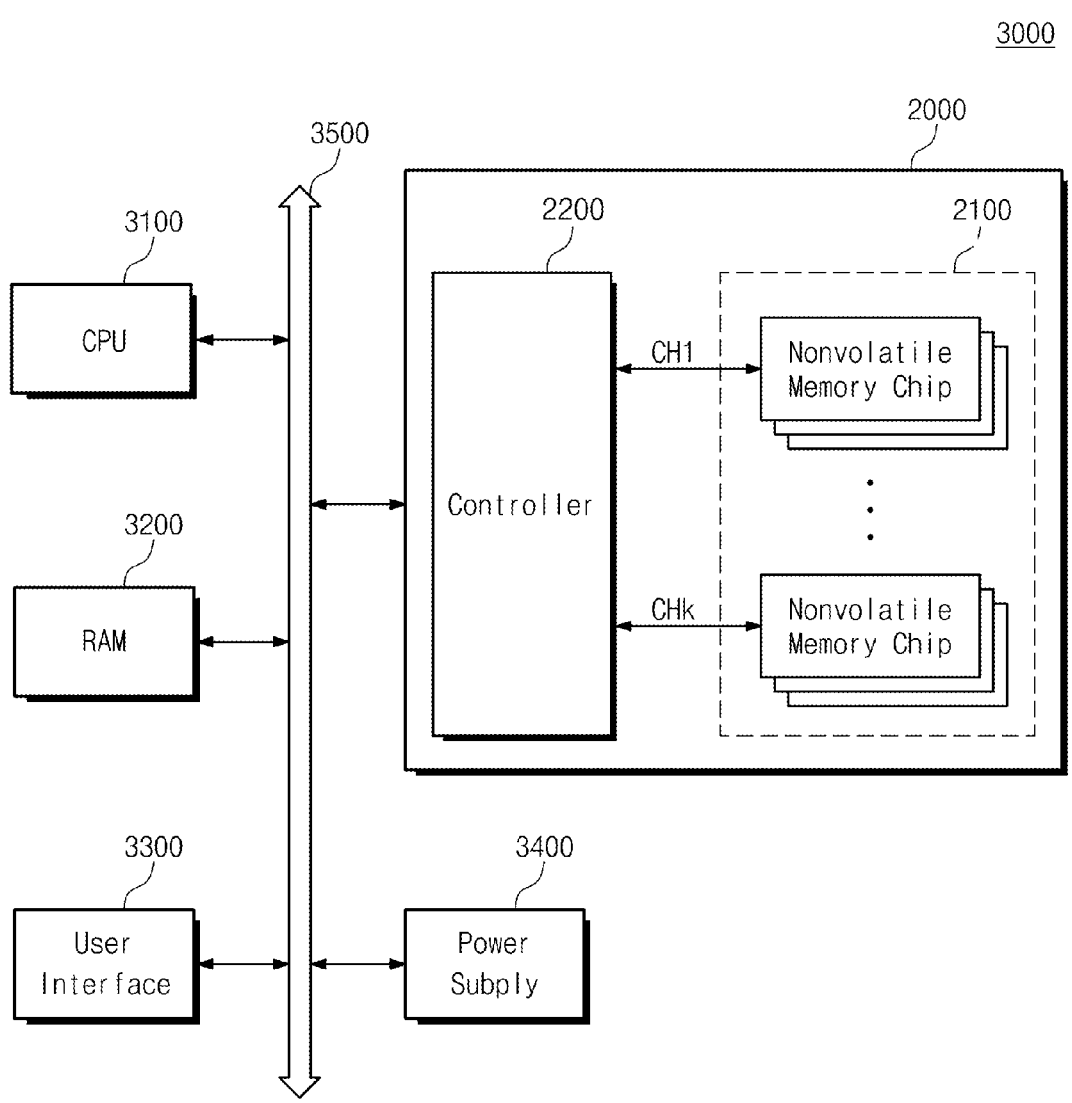
FIG. 17 is a block diagram illustrating a computing system including a memory system in FIG. 16.

FIG. 17 is a block diagram illustrating a computing system including a memory system in FIG. 16. Referring to FIG. 17, a computing system 3000 may include a CPU 3100, a RAM 3200, a user interface 3300, a power supply 3400, and a memory system 2000.

The memory system 2000 may be electrically connected with the CPU 3100, the RAM 3200, the user interface 3300, and the power supply 3400 via a system bus 3500. Data provided via the user interface 3300 or processed by the CPU 3100 may be stored in the memory system 2000.

In FIG. 17, there is exemplarily shown the case that a nonvolatile memory device 2100 is connected with the system bus 3500 via a controller 2200. However, the nonvolatile memory device 2100 can be configured to be connected directly with the system bus 3500.

The memory system 2000 described with reference to FIG. 16 is illustrated in FIG. 17. However, the memory system 2000 can be replaced with a memory system 1000 described with reference to FIG. 11.

In an exemplary embodiment, the computing system can be configured to include all memory systems 1000 and 2000 described in FIGS. 11 and 16.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of operating a nonvolatile memory device, the nonvolatile memory device including a plurality of memory cells and a plurality of monitor cells connected to a same word line, the method comprising:
    erasing the plurality of memory cells and the plurality of monitor cells;
    programming at least one first memory cell among the plurality of memory cells to a first program state and program-verifying the at least one first memory cell using a first verification voltage;
    programming at least one first monitor cell among the plurality of monitor cells to the first program state and program-verifying the at least one first monitor cell using a first monitor verification voltage which is lower than the first verification voltage and higher than a first read voltage used to distinguish an erase state and the first program state;
    programming at least one second memory cell of the plurality of memory cells to a second program state and program-verifying the at least one second memory cell using a second verification voltage higher than the first verification voltage;
    programming at least one second monitor cell of the plurality of monitor cells to the first program state and program-verifying the at least one second monitor cell using a second monitor verification voltage higher than the first verification voltage and lower and a second read voltage used to distinguish the first program state and second program state; and
    programming at least one third monitor cell of the plurality of monitor cells to the second program state and program-verifying the at least one third monitor cell using a third monitor verification voltage higher than the second read voltage and lower than the second verification voltage; and
    refreshing data stored in the plurality of memory cells according to a result read from the at least one first monitor cell during a read operation of the at least one first monitor cell.

2. The operating method of claim 1, wherein the at least one second monitor cell, the at least one first memory cell and the at least one first monitor cell are programmed at the same time by applying a program voltage to the same word line.

3. The operating method of claim 1, wherein the refreshing data stored in the plurality of memory cells comprises:
    reading data stored in the plurality of memory cells; and
    writing the read data in other memory cells.

4. The operating method of claim 1, wherein the refreshing data stored in the plurality of memory cells comprises:
    refreshing data stored in the plurality of memory cells when the at least one first monitor cell is judged to have a threshold voltage lower than the first read voltage.

5. The operating method of claim 1, wherein the refreshing data stored in the plurality of memory cells comprises:
    refreshing data stored in the plurality of memory cells when the at least one second monitor cell is judged to have a threshold voltage higher than the second read voltage.

6. The operating method of claim 1, wherein the refreshing data stored in the plurality of memory cells comprises:
    refreshing data stored in the plurality of memory cells when the at least one third monitor cell is judged to have a threshold voltage lower than the second read voltage.

7. The operating method of claim 1, wherein two or more monitor cells of the plurality of monitor cells are programmed to have the first program state.

8. The operating method of claim 7, wherein the refreshing data stored in the plurality of memory cells comprises:
    refreshing the plurality of memory cells when the result read from a majority of the two or more monitor cells does not correspond to the first program state.

9. The operating method of claim 1, wherein the refreshing data stored in the plurality of memory cells comprises:
    refreshing data stored in the plurality of memory cells when the result read from one or more of the at least one monitor cells does not correspond to the first program state.

10. A method of operating a nonvolatile memory device, the nonvolatile memory device including a plurality of memory cells and a plurality of monitor cells, the method comprising:
    erasing the plurality of memory cells and the plurality of monitor cells;
    programming at least one first memory cell among the plurality of memory cells to a first program state;
    programming at least one first monitor cell among the plurality of monitor cells to the first program state; and
    refreshing data stored in the plurality of memory cells according to a result read from the at least one first monitor cell during a read operation of the at least one first monitor cell, wherein the at least one first memory cell and the at least one first monitor cell are programmed at the same time, and wherein when the at least one first memory cell is program passed in a read verification during programming of the at least one first memory cell, the at least one first monitor cell is judged to be program passed regardless of a read verification result during programming of the least one first monitor cell.

11. A method of operating a memory system, the memory system including a nonvolatile memory device having a plurality of memory cells and a plurality of monitor cells, and a controller configured to control the nonvolatile memory device, the method comprising:

erasing the plurality of memory cells according to an erase command from the controller by the nonvolatile memory device;

programming at least one memory cell of the plurality of memory cells to a program state and at least one monitor cell of the plurality of monitor cells to a program monitor state according to a write command from the controller by the nonvolatile memory device; and refreshing the plurality of memory cells according to a result read from the at least one monitor cell during a read operation of the at least one monitor cell, the nonvolatile memory device reading the at least one monitor cell to generate a monitor result, during an idle state of the nonvolatile memory device.

12. The operating method of claim 11, wherein the refreshing the plurality of memory cells comprises:

the nonvolatile memory device transferring a read result and the monitor result to the controller according to a read command from the controller; and refreshing the plurality of memory cells when the monitor result indicates that a state of the at least one monitor cell is not the program monitor state.

13. The operating method of claim 11, wherein the said refreshing the plurality of memory cells comprises:

the nonvolatile memory device transferring the monitor result to the controller according to a read status command from the controller; and refreshing the plurality of memory cells when the monitor result indicates that a state of the at least one monitor cell is not the program monitor state.

14. A method of operating a nonvolatile memory device, the nonvolatile memory device including a memory cell array including a plurality of memory cells and a plurality of monitor cells, wherein a programmed state of each memory cell and each monitor cell is determined by a threshold voltage of each memory cell and monitor cell, the method comprising:

erasing the memory cells and the monitor cells;

programming at least one of the memory cells and at least one of the monitor cells from an erase state to a first program state according to memory cell write data and monitor cell write data, respectively, wherein the at least one of the memory cells is programmed to the first program state by executing a programming operation using a memory cell read verification voltage, and the at least one of the monitor cells is programmed to the first program state by executing a programming operation using a monitor cell read verification voltage;

reading the monitor cells to obtain monitor data;

comparing the monitor data with the monitor cell write data to obtain a comparison result; and executing a refresh operation of the memory cells in accordance with the comparison result, wherein the at least one of the memory cells and the at least one of the monitor cells are programmed at the same time, and wherein when the at least one of the memory cells is program passed in a read verification during programming of the at least one of the memory cells, the at least one of the monitor cells is judged to be program passed regardless of a read verification result during programming of the least one of the monitor cells.

15. The method of claim 14, wherein the monitor cell read verification voltage is less than the memory cell read verification voltage, and a threshold voltage distribution of the monitor cells programmed to the first program state is less than a threshold voltage distribution of the memory cells programmed to the first program state.

16. The method of claim 15, wherein the memory cells and the monitor cells are NAND flash memory cells.

17. The method of claim 16, wherein the memory cells and the monitor memory cells are connected to a same word line.

* * * * *